(12) United States Patent
Knickerbocker et al.

(10) Patent No.: US 12,015,003 B2
(45) Date of Patent: Jun. 18, 2024

(54) HIGH DENSITY INTERCONNECTION AND WIRING LAYERS, PACKAGE STRUCTURES, AND INTEGRATION METHODS

(71) Applicant: International Business Machines Corporation, Armonk, NY (US)

(72) Inventors: John Knickerbocker, Monroe, NY (US); Mukta Ghate Farooq, Hopewell Junction, NY (US); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 17/488,968

(22) Filed: Sep. 29, 2021

(65) Prior Publication Data
US 2023/0100769 A1    Mar. 30, 2023

(51) Int. Cl.
*H01L 21/48* (2006.01)
*H01L 21/683* (2006.01)
(Continued)

(52) U.S. Cl.
CPC .......... *H01L 24/20* (2013.01); *H01L 21/4857* (2013.01); *H01L 21/4871* (2013.01); *H01L 21/6835* (2013.01); *H01L 23/3675* (2013.01); *H01L 23/5383* (2013.01); *H01L 23/5386* (2013.01); *H01L 23/66* (2013.01); *H01L 24/19* (2013.01); *H01P 3/003* (2013.01); *H01P 11/003* (2013.01); *H01L 2221/68368* (2013.01);
(Continued)

(58) Field of Classification Search
CPC . H01L 24/20; H01L 21/4857; H01L 21/4871; H01L 21/6835; H01L 23/3675; H01L 23/5383; H01L 23/5386; H01L 23/66; H01L 24/19; H01L 2221/68368; H01L 2223/6616; H01L 2223/6627; H01L 2224/2105; H01L 2924/17151; H01L 2924/19033; H01L 2224/12105; H01L 25/105; H01L 2225/1082; H01L 24/81; H01L 24/96; H01L 25/50; H01L 25/0657; H01L 24/13; H01L 2224/14181; H01L 2224/16145; H01L 2224/81005; H01L 2225/06513; H01L 2225/06517; H01L 2225/06568; H01L 2225/06586; H01L 2225/06589; H01L 2225/1035; H01L 2225/1064; H01L 2225/1094; H01L 2924/16235; H01P 3/003; H01P 11/003
USPC ....................................................... 257/664
See application file for complete search history.

(56) References Cited

U.S. PATENT DOCUMENTS 5,534,466 A    7/1996  Perfecto et al.
5,995,379 A   11/1999  Kyougoku et al.
(Continued)

*Primary Examiner* — Vu A Vu
(74) *Attorney, Agent, or Firm* — Michael O'Keefe

(57) ABSTRACT

An interconnect for a semiconductor device includes a laminate substrate; a first plurality of electrical devices in or on a surface of the laminate substrate; a redistribution layer having a surface disposed on the surface of the laminate substrate; a second plurality of electrical devices in or on the surface of the redistribution layer; and a plurality of transmission lines between the first plurality of electrical devices and the second plurality of electrical devices. The surface of the laminate substrate and the surface of the redistribution layer are parallel to each other to form a dielectric structure and a conductor structure.

19 Claims, 6 Drawing Sheets

(51) Int. Cl.
*H01L 23/00* (2006.01)
*H01L 23/367* (2006.01)
*H01L 23/538* (2006.01)
*H01L 23/66* (2006.01)
*H01P 3/00* (2006.01)
*H01P 11/00* (2006.01)

(52) U.S. Cl.
CPC ............... *H01L 2223/6616* (2013.01); *H01L 2223/6627* (2013.01); *H01L 2224/2105* (2013.01); *H01L 2924/17151* (2013.01); *H01L 2924/19033* (2013.01)

(56) References Cited

U.S. PATENT DOCUMENTS

| | | |
|---|---|---|
| 6,000,130 A | 12/1999 | Chang |
| 6,281,452 B1 | 8/2001 | Prasad et al. |
| 6,444,919 B1 | 9/2002 | Economikos et al. |
| 6,876,074 B2 | 4/2005 | Kim |
| 6,998,327 B2 | 2/2006 | Danielson et al. |
| 7,141,916 B2 | 11/2006 | Takahashi et al. |
| 7,589,407 B2 | 9/2009 | Karnezoa |
| 7,811,854 B2 | 10/2010 | Gabara |
| 8,580,581 B2 | 11/2013 | Sekine et al. |
| 8,884,431 B2 * | 11/2014 | Lin .................. H01L 23/49816 257/738 |
| 8,901,727 B2 * | 12/2014 | Kang .................. H01L 25/0657 257/E25.027 |
| 9,087,835 B2 * | 7/2015 | Sutardja ............ H01L 23/49822 |
| 9,324,698 B2 | 4/2016 | Yu |
| 9,337,135 B2 * | 5/2016 | Lii ............................ H01L 25/50 |
| 9,412,707 B2 * | 8/2016 | Chung .................. H01L 23/562 |
| 9,418,953 B2 * | 8/2016 | Yu ............................ H01L 24/11 |
| 9,520,373 B2 | 12/2016 | Kim |
| 9,559,081 B1 | 1/2017 | Lai |
| 9,691,635 B1 | 6/2017 | Huemoeller |
| 9,704,825 B2 * | 7/2017 | Wu ...................... H01L 23/5389 |
| 9,871,014 B2 * | 1/2018 | Haba ....................... H01L 24/05 |
| 9,978,702 B2 | 5/2018 | Russell |
| 10,304,794 B2 | 5/2019 | Hu |
| 10,373,918 B2 | 8/2019 | Hu |
| 10,510,695 B2 | 12/2019 | Yu |
| 10,867,961 B2 | 12/2020 | Hu |
| 10,903,166 B2 | 1/2021 | Ganesan |
| 10,916,495 B2 | 2/2021 | Choi |
| 11,387,202 B2 * | 7/2022 | Haba ....................... H01L 24/80 |
| 11,610,812 B2 * | 3/2023 | Huang .................. H01L 25/50 |
| 11,626,340 B2 * | 4/2023 | Anderson ............... H01L 21/78 257/664 |
| 2007/0148819 A1 | 6/2007 | Haba et al. |
| 2010/0237481 A1 | 9/2010 | Chi |
| 2012/0193781 A1 * | 8/2012 | Costa .................. B81B 7/0006 257/737 |
| 2021/0202437 A1 | 7/2021 | Chang Chien |
| 2022/0320299 A1 * | 10/2022 | Chen .................. H01L 27/0688 |

* cited by examiner

HIGH DENSITY INTERCONNECTION AND WIRING LAYERS, PACKAGE STRUCTURES, AND INTEGRATION METHODS

BACKGROUND

The exemplary embodiments described herein relate generally to semiconductor devices and methods for the fabrication thereof and, more specifically, to interconnection and wiring layers for semiconductor package structures.

Semiconductor packaging structures generally employ a variety of electronic devices, typically chips, and other electronic components, mounted on substrates using area arrays of solder bumps or copper pillar/solder interconnections or wirebonding techniques. The substrates may be comprised of multi-layer ceramic, multi-layer organic-laminate (a core layer with drilled vertical plated through holes (PTH) and subsequent sequential build up layers of wiring and vias on either side of the core and/or use of other higher density layers with wiring and vias, silicon, glass, combinations of the above substrate materials or other substrate technologies. The chips integrated on substrates are often mounted onto larger printed wiring boards (PCB) such as with ball grid array interconnections or socket interconnections that allow a large number of chips to have electrical links for communications within the substrate, the substrates and PCB, or beyond the board via electrical and/or optical links to other chips beyond those on the PCB. In some semiconductor packaging such as wafer level processing, use of chips mounted on a temporary carrier of wafer size or panel size are either mounted first as known good die or last after testing for known good die. A first approach mounts a known good die first followed by chip-to-chip wiring. The alternative method is wiring first and chip attachment last. In addition for these packages, sequential molding processes are often used in the fabrication of such chips first and/or chips last build structures. The chips are connected to other chips or to other electronic components and may also be connected to I/O ports on the carrier boards. As the number of chips or other electronic components on the carrier boards increases and the density of interconnections between chips increases to support next generations of product applications (artificial intelligence, cloud computing, mobile computing, etc.), the chips and components may be layered to provide for increasing density of interconnections at finer pitch, lower energy communication links, and sufficient area for interconnections often using horizontal X+Y wire patterning and vertical Z interconnection vias for high bandwidth chip-to-chip integration.

In order to optimize the cost and time to market integrated chips on substrates for products, use or reuse of a portion of chip function at different technology nodes combined with next generation of chips can be integrated on a package or substrate. These lower cost and high yielding small size chips called chiplets provide opportunity to optimize chip supplier, cost, and scale up to higher volume to support applications needs. These smaller chiplets can be integrated on a substrate using adjacent chiplet attachment but requiring higher density wiring such as fine pitch wiring and fine pitch chip input/output (I/O pads) and/or 3D die stacking using through silicon vias (TSV). The integration of chips and/or chiplets also requires build and assembly yield at high level for optimized product yield and product cost. For substrate build and integrated module assembly yield with multiple chiplets, it is desirable to consider lower cost packaging that may benefit from a parallel build of portions of the substrate rather than traditional sequential build of advanced wiring layers on laminate packaging since high numbers of advanced wiring layers sequentially built on laminate often are at much higher cost. Therefore, parallel built high density wiring layers, such as thin film technology, helps to minimize the number of layers with high density wiring while still supporting integration of chiplets and electronic components. Note the thin film layers may support integration of both surface mounted chiplets, stacked 3D chips or chiplets, and embedded components of high density bridge chips to support high bandwidth chip-to-chip interconnection. Such thin films are generally polyimides or other polymeric materials having low dielectric constants and being capable of supporting copper wiring, high bandwidth, low energy communications and signal integrity with low loss to support multichip communications and competitive performance for targeted applications. In particular, polyimide-copper thin film (TF) structures may be employed to allow for the incorporation of conductive wire patterning and formation of vias at a higher density than other types of cost competitive carrier packaging. Furthermore, for more complex multi-chiplet integration and for higher performance applications, integration of more chiplets becomes important with high density I/O and wiring density and larger X-Y size integrated thin film size and/or increased numbers of layers. Therefore there is a need to ensure high yield assembly of chiplets, packaging, precision control of chiplets, co-planarity and interconnection pad of the chiplets, integrated components, bridge chips, capacitors, inductors, chip stacks, DRAM, SRAM, High Bandwidth Memory (HBM) stacks, other memory, CPU, GPU, accelerators, FPGA, ASIC, photonics chips, photonics waveguides/packaging and/or other electronics and optical components and package-to-package integration, which are all important. Therefore, precision control during build such as sequential or parallel build of wafer level and/or panel level packaging for the thin film and electronic chiplets and/or components must be managed to achieve higher yield assemblies. Further limitations of ground rules can be impeded by lithography limitations for X-Y field size for processing for full field or step and repeat processing (including one or more image field overlap) of these high density integrated substrate and chiplet structures as well as integration to any base or multiple base substrate(s) technology and/or printed circuit board technologies.

However, in the fabrication processes, molding for chips, chiplets, or components (first face up or face down) may cause the chips or other components to shift, which may result in chip breakage, package co-planarity and distortions during processing and/or assembly, or interruptions, or lower yield in the interconnections, particularly at I/O ports (or can impact product reliability. Furthermore, even without chip shifting, materials from which the structures are fabricated may experience shrinkage, warping, or other variation in their dimensions. In doing so, the wire patterning and vias, particularly in TF structures having higher densities of such patterning layouts, may be distorted, which may cause issues with regard to co-planarity between surfaces, fine pitch assembly yield losses, alignment of vias, alignment of interconnections between chips and/or other devices, alignment of interconnection pads, and co-planarity challenges between these high density thin film layers and other base packages and/or printed wiring boards. If such issues are realized, operation of semiconductor devices having these structures may lead to performance deficits and compromises in yield and reliability of the semiconductor devices into which these packages are incorporated, particularly in AI or in high bandwidth applications.

BRIEF SUMMARY

In one exemplary aspect, an interconnect for a semiconductor device comprises a laminate substrate; a first plurality of electrical devices in or on a surface of the laminate substrate; a redistribution layer having a surface disposed on the surface of the laminate substrate; a second plurality of electrical devices in or on the surface of the redistribution layer; and a plurality of transmission lines between the first plurality of electrical devices and the second plurality of electrical devices. The surface of the laminate substrate and the surface of the redistribution layer are parallel to each other to form a dielectric structure and a conductor structure.

In another exemplary aspect, a method of forming a semiconductor device comprises forming a coreless laminate substrate; forming a first plurality of electrical devices in or on a surface of the laminate substrate; forming interconnection ports at the first plurality of electrical devices; forming a redistribution layer on the surface of the laminate substrate, the redistribution layer having a second plurality of electrical devices on or in a surface of the redistribution layer; and connecting the redistribution layer to the laminate substrate such that the second plurality of electrical devices is interconnected to the first plurality of electrical devices through the interconnection ports. When the redistribution layer is connected to the laminate substrate, the surface of the laminate substrate and the surface of the redistribution layer are parallel to each other.

In another exemplary aspect, a method for fabricating an interconnect for a semiconductor device comprises forming a coreless laminate substrate; forming a first plurality of electrical devices in or on a surface of the laminate substrate; forming first ends of interconnection ports at the first plurality of electrical devices; forming a second plurality of electrical devices at second ends of the interconnection ports distal from the first ends; forming a redistribution layer on a handle layer, the redistribution layer having a third plurality of electrical devices in or on the redistribution layer; connecting the redistribution layer to a handle layer; disposing the handle layer onto the second plurality of electrical devices; and removing the handle layer. The surface of the laminate substrate and the surface of the redistribution layer are parallel to each other to form a dielectric structure and a conductor structure.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments described herein involve the fabrication of semiconductor devices having novel coplanar interconnection layers, packaging structures and methods that support the creation of high-density coplanar RDL wiring layers, and fine pitch-high I/O interconnection layers with coplanar laminate board structures. Micro-pillar/tall via and jog structure options that address coplanarity, alignment and reliability enhancement, fine pitch, and high bandwidth interconnection are also described herein.

Figure 1A:
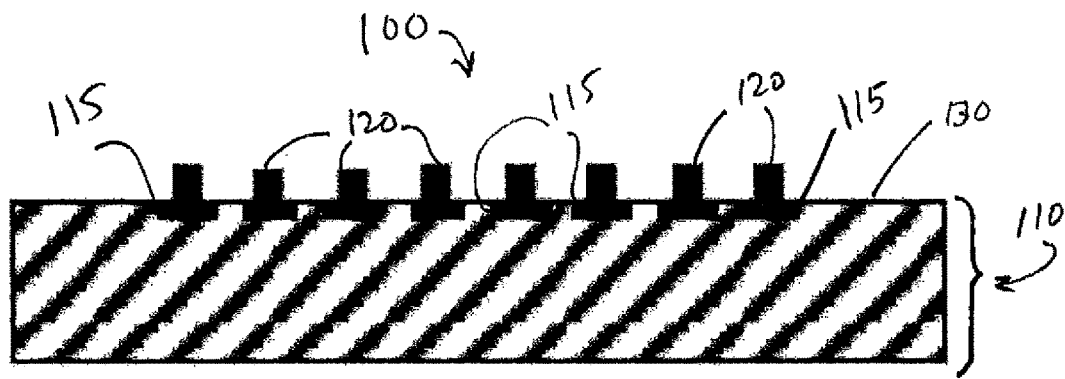
FIG. 1A is a schematic representation of a laminate substrate having electrical components and metal connection posts.

In one exemplary embodiment, referring to FIGS. 1A-1D, structures for WLP and/or TF and laminate or board integration with semiconductor dies (also known as chips or chiplets) are shown. As used herein, a semiconductor die (or simply "die") is a block of semiconducting material on which a functional circuit is fabricated. In FIG. 1A, a careless package or multi-layer base laminate substrate, shown generally at 100, is fabricated in a first step. In fabricating the careless package 100, layers are deposited sequentially and built up to form a laminate substrate or "laminate 110." A plurality of sequentially-deposited layers forming the laminate 110 defines a board structure. In some embodiments, the build up of layers to form the laminate 110 may include the addition of electrical devices or components 115, which may be surface capacitors, inductors, transistors, sensors, memory devices, or the like, which may be embedded into the material of the laminate 110. Transmission lines, which in this embodiment are metal posts, pillars, or "micro-posts 120" formed in an upper surface 130 of the laminate 110, facilitate electrical communication to and from the components 115, such micro-posts 120 being in contact with the components 115. The micro-posts 120 comprise suitable metals, such as, for example, copper, nickel, gold, tungsten, molybdenum, aluminum, tin, silver, solder, and combinations and alloys of any of the foregoing materials.

Figure 1B:
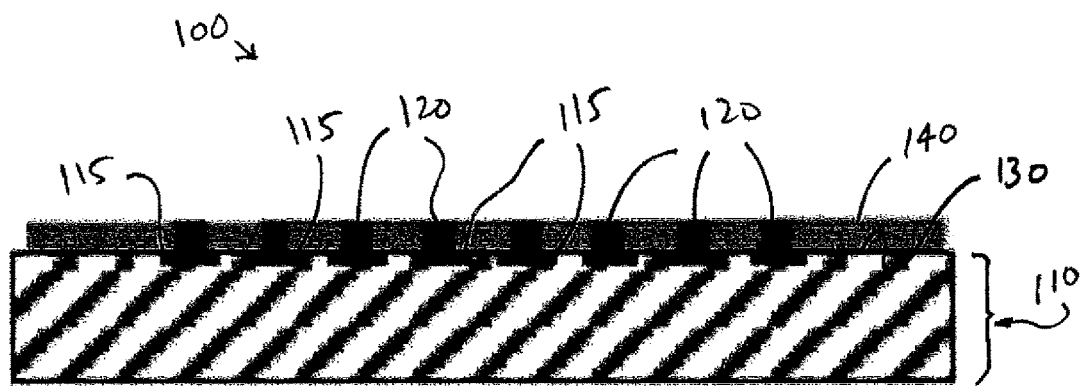
FIG. 1B is a schematic representation of the laminate substrate of FIG. 1A having a board surface on an upper surface of the laminate substrate.

As shown in FIG. 1B, a planar laminate or board surface 140 is created on the upper surface 130 in a second step. The board surface 140 may be created on the upper surface 130 using any suitable deposition, spin on, or curtain flow technique. In the alternative, the board surface 140 may be created using a sheet adhesive attachment, lamination, or pressure mold technique. In any embodiment in which the board surface 140 is created, the material of the board surface 140 may be cured as needed. Once created (and cured, if needed), the board surface 140 may be planarized such that upper ends of the micro-posts 120 are exposed and level with an upper surface of the board surface 140. Any suitable planarization technique may be used, such as milling, chemical-mechanical polishing (CMP), grinding, or laser milling. After planarization, the micro-posts on the surface passing through the dielectric or through the dielectric to an underlying or embedded chip or electronic component can remain as a micro-post such as copper for additional processing layers of vias, wiring, and dielectric, or they may receive deposition of an underbump metallurgy, pillar, and/or solder. Exposed upper ends of the micro-posts 120 may be cleaned with lasers, chemical etches, or the like. In the alternative, the exposed upper ends of the micro-posts 120 may have under bump metallurgy (UBM) structures deposited thereon (for example, nickel, gold, or polyimide (such as a low temperature polyimide or a photosensitive polyimide)) if using a solder interconnect. In some embodiments, polyimide may be spun onto a wafer and disposed around and/or over any micro-posts 120 (or other pillars, posts, or micro-pillars) depending on the process parameters, dielectric thickness, and post or pillar height. If polyimide is applied over a pillar or post, then a planarization technique may be used to remove it. Alternatively, post or pillars may have a photo-resist build on the top of the post or pillar to avoid polyimide build up over the top. In such cases, after polyimide deposition, spin-on, and cure, the photo-resist may be removed to expose the top of the post or pillar, or UBM structures may be applied on top of the posts or pillars for connection during added processing steps.

Figure 1C:
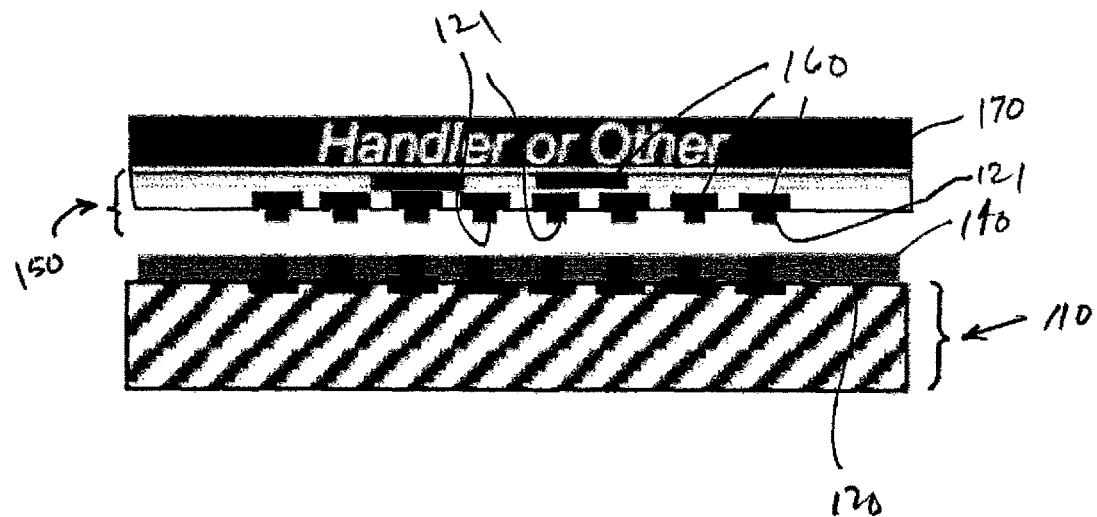
FIG. 1C is a schematic representation of the laminate substrate being connected to a redistribution layer.

As shown in FIG. 1C, a Re-Distribution layer (RDL) 150 and associated dies and/or components 160 are disposed on a handle layer 170 and coupled to the laminate 110 in a third step such that the components 160 are interconnected to the components 115. RDL 150 (as well as other RDLs described herein) is generally an additional metal layer on a semiconductor device that allows for connection of I/O ports of a circuit to other locations on the same device. Components 160 may be embedded into the RDL 150. Tests to determine suitability of the laminate 110, RDL 150, and any dies or components 160 embedded into the RDL 150 may be carried out. Micro-posts 121 or pillars may extend through a portion of the RDL 150 and to wiring levels below the RDL 150 or to chips, chiplets, and/or components therein.

Figure 1D:
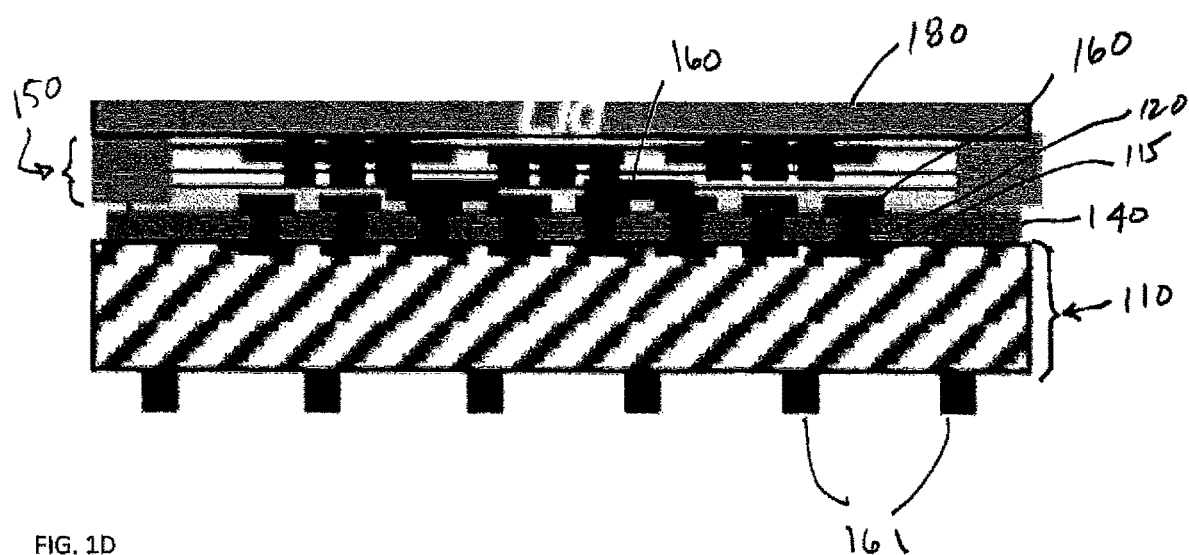
FIG. 1D is a schematic representation of the laminate substrate coupled to the redistribution layer and having a lid disposed on the redistribution layer.

As shown in FIG. 1D, in a fourth step, after coupling the RDL 150 to the laminate 110, the RDL 150 is disposed on the board surface 140 such that components 160 in the RDL 150 are aligned with and interconnected to the micro-posts 120 in the laminate 110. The components 160 may be connected to the micro-posts 120 (and thereby to the components 115) by soldering with a suitable flux or by using a fluxless joining technique. In some embodiments, a solder interconnect may comprise a low temperature solder and/or a near-match solder having a similar coefficient of thermal expansion relative to the RDL and the laminate. The RDL 150 is adhered to the board surface 140 using a flowable adhesive dielectric material such as polyimide or photosensitive polyimide that forms a thin film. Surfaces may be activated for OF flow, for example, using options for vacuum, pressure, and/or vent port holes in the RDL 150 and/or the laminate 110 and/or the board surface 140. The handle layer 170 is then removed and hardware testing is performed. Rework may be carried out as needed. An added alternative structure and method to avoid run out or die and/or component movement rather than capillary under fill (CUF) or under fill (UF) could be chip and or component attachment to a handle wafer or panel as temporary adhesive (or permanent adhesive if using a thinned Si interposer with TSV or alternate permanent packaging structure) using high temperature adhesive such as polyimide adhesive. This may support and/or avoid chip and or component movement during molding. A thermal lid 180 is then attached, and a TIM may be applied. BGA and LGA socket testing may be carried out. Other integration sequence options may be used. Interconnections 161 may extend from the laminate 110, such interconnections 161 being, for example, ball grid array bumps, copper pillars with solder for electrical connection, column grid arrays, and the like. Each of such interconnections 161 may be for surface mount (solder attachment to a PCB or card), or they may be pins for socket attachment to a board or card.

Figure 2A:
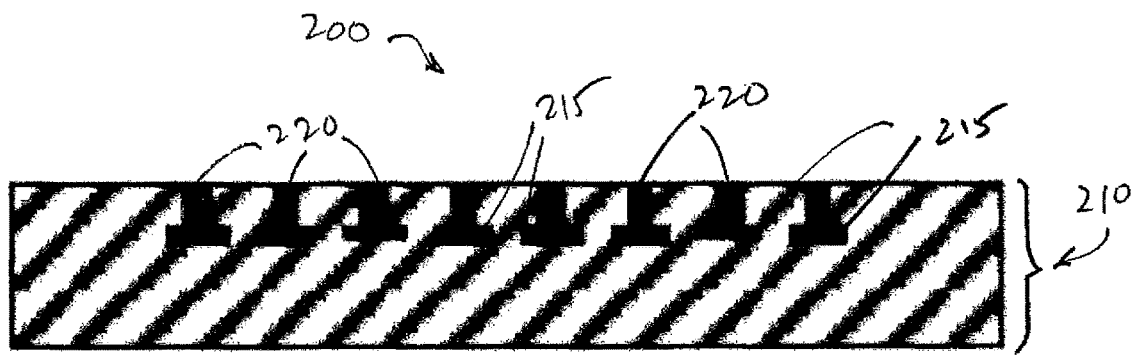
FIG. 2A is a schematic representation of a laminate substrate having electrical components and vias for connections.

In another exemplary embodiment, referring to FIGS. 2A-2D, additional structures for WLP and/or TF and laminate or board integration with semiconductor dies are shown. In FIG. 2A, a coreless package, shown generally at 200, is fabricated in a first step. In fabricating the coreless package 200, layers are deposited to form a laminate 210. The top layers of the laminate 210 may include vias 220 as the transmission lines, for example, tall vias and/or offset (jogged) vias, as well as pillars of metal and/or pads for connection to a dense RDL. The bottom layers may include embedded components 215 (for example, silicon interposers, other components/chips, and the like).

Figure 2B:
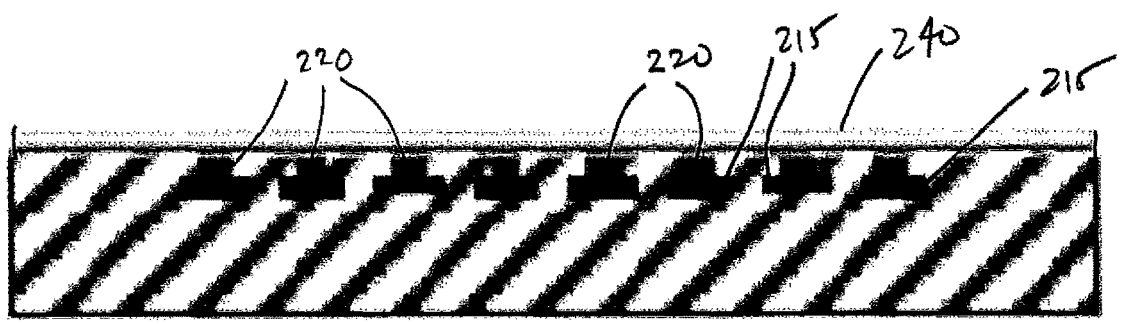
FIG. 2B is a schematic representation of the laminate substrate of FIG. 2A having a planarized board surface over the vias.

As shown in FIG. 2B, a planar laminate or board surface 240 may be created on the top layer of the laminate 210 in a second step. Planarization may be carried out on the board surface 240 to within the height of the vias 220 (the tall vias or the jogged vias). The planarized surface may be cleaned. UBM may be used to join the components 215, with soldering techniques being used as needed to attach the components.

Figure 2C:
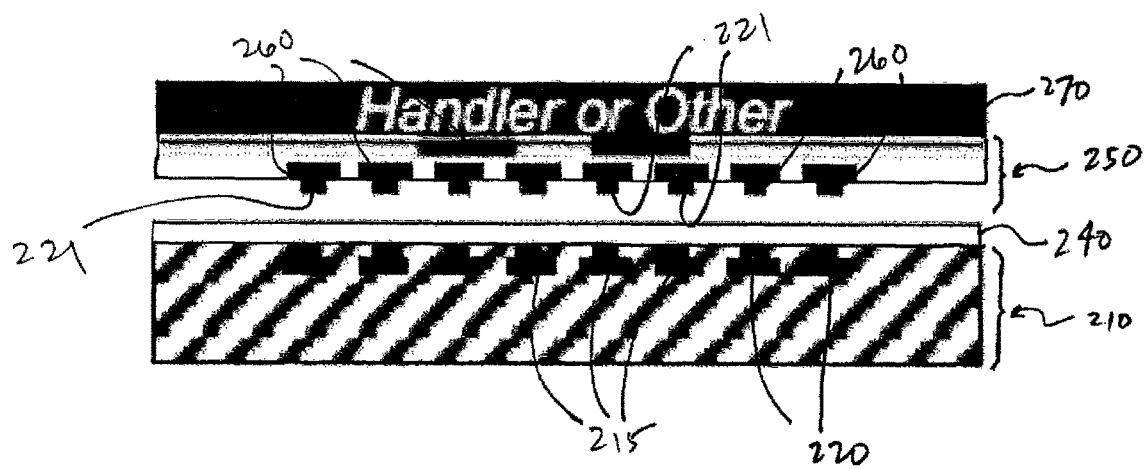
FIG. 2C is a schematic representation of the laminate substrate of FIG. 2B being connected to a redistribution layer.

As shown in FIG. 2C, an RDL 250 and associated dies, chiplets, and/or other components 260 are disposed on a handle layer 270 and coupled to the laminate 210 in a third step such that components 215 and components 260 are interconnected. Components 260 may be on and/or embedded into the RDL 250. Tests to determine suitability of the laminate 210, RDL 250, and components 260 may be performed. Micro-posts 221 may extend from the components 260.

Figure 2D:
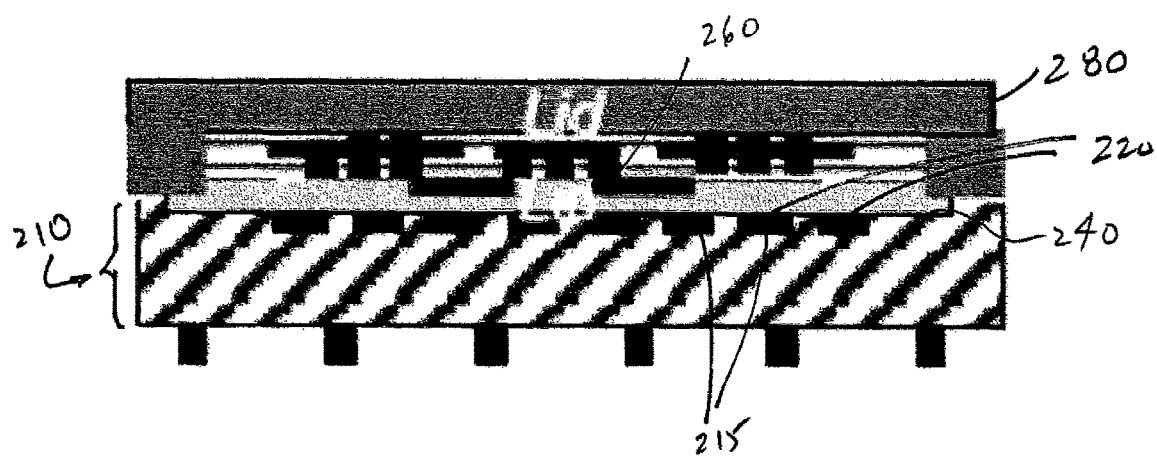
FIG. 2D is a schematic representation of the laminate substrate coupled to the redistribution layer and having a lid disposed on the redistribution layer.

As shown in FIG. 2D, the RDL 250 and any associated dies and/or components 260 are joined to the board surface 240 in a fourth step such that alignment and interconnection of the dies and/or components 260 with the vias 220 in the laminate 210 (and thereby connection to the components 215) is realized by solder interconnection, interconnection of alternative electrical interconnection, (solder ball, microbump, pillar or post or the like for pad-to-pad electrical connections and dielectric non-conductive film), capillary under fill molding, or alternate adhesive for dielectric-to-dielectric and component integration. The interconnection to the vias 220 may be by solder and NCP or, in the alternative, other electrical interconnections between joining electrical pads and use of dielectric adhesives between dielectric in each substrate surface layer. The handle layer 270 is removed, and a thermal lid 280 is then attached, and BGA socket testing may be performed. Other integration sequence options may be used.

Figure 3A:
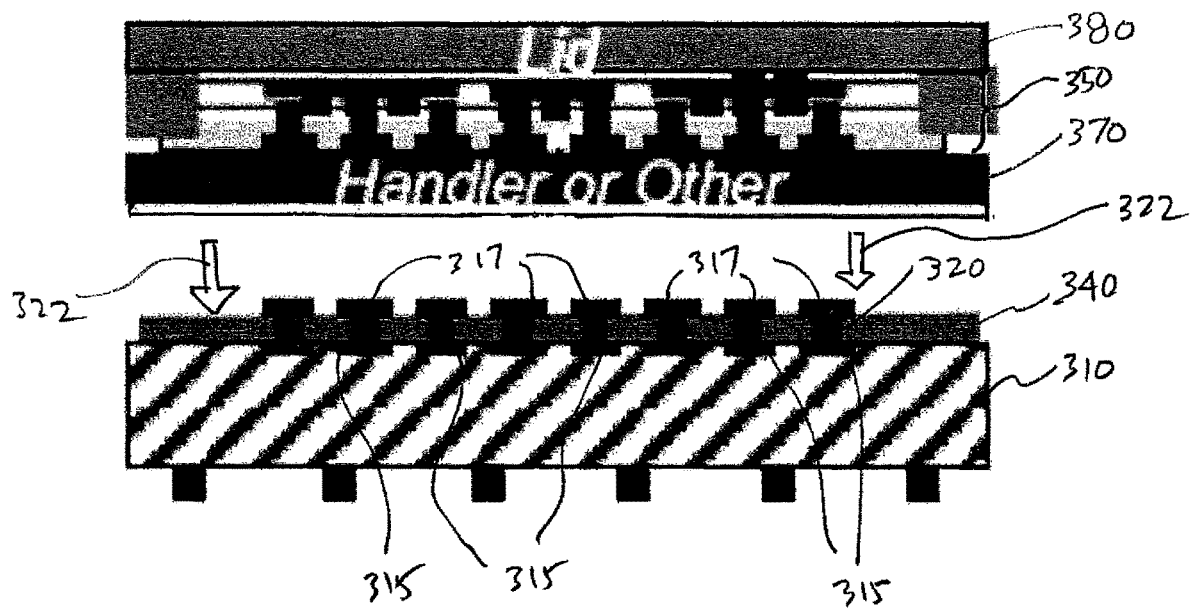
FIG. 3A is a schematic representation of a laminate substrate having integrated electrical components and metal posts and attachment thereof to a redistribution layer using a handle layer.
Figure 3B:
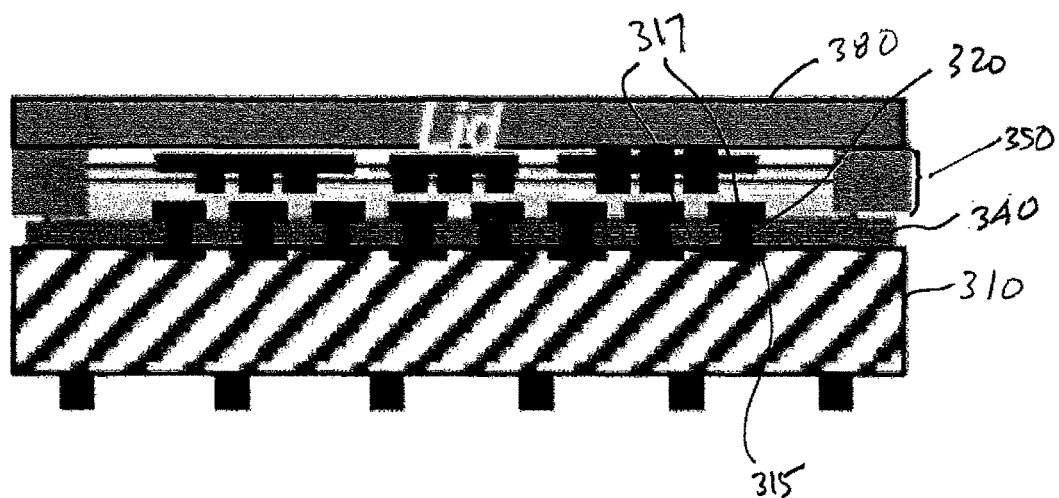
FIG. 3B is a schematic representation of the laminate substrate of FIG. 3A attached to the redistribution layer and having a lid.

In another exemplary embodiment, referring to FIGS. 3A and 3B, structures for WLP and/or TF and laminate or board integration with semiconductor dies are shown. Processes may be carried out as illustrated in FIGS. 1A and 1B and tested; however, FIG. 3A illustrates an embodiment in which a laminate structure 310 is assembled with known good dies and embedded components 315 and/or integrated chiplets and/or known good silicon interposers. Pillars, metal posts, or micro-posts 320 are formed as in previous embodiments. A board surface 340 is created as in previous embodiments, and planarization may be carried out. The laminate structure 310 is then flipped, and assembly with additional components 317 or integrated chiplets is carried out on an opposite surface or cavities on the laminate side that could be joined to a printed circuit board or print circuit card such as with but not limited to ball grid array (BGA) or by pluggable socket attachment. Flipping of the laminate structure 310 may be carried out with a handle wafer or panel. Flipping from one handle wafer or panel to another (in thin film applications) may also include embedded chips or components and may also provide for the joining of a co-planar surface to an interconnect layer. Additionally, or in the alternative, in joining the thin film layer to the laminate structure 310, copper posts and adhesives may be used. Board surfaces may also include cavities in the adhesive for chips or components that are mounted on the laminate surface or on the thin film bottom surface, or such cavities could have chips such as bridge chips or other chips or electronic components embedded in the adhesive layer with corresponding posts, pads, and solder connections to support added function to the module. Board surfaces may also be flipped by transfer joining from one handle wafer or panel to another such that the upside down surface is available for joining to the laminate or thin film layer. Further components can be added to or are embedded into an RDL 350 disposed on a handle layer 370, and a lid 380 is applied to the RDL 350 either prior to or post flipping and further chip or embedding of chips and/or components and RDL processing/integration. Optional testing of the integrated RDL 350 and components for known good sub-assembly is then performed. The handle layer 370 (or other device) is applied to the surface on which the additional components 317 were integrated as shown by arrows 322.

As shown in FIG. 3B, the handle layer 370 is removed. The sub-assemblies (for example, the RDL 350 and the laminate structure 310) are then aligned and integrated as coplanar (or parallel) laminates using solder, copper pillar/solder, or Cu—Cu interconnects, each with OF, as transmission lines to provide for electrical communication. NCP or adhesives may be used to further facilitate connection of the RDL 350 to the board surface 340. Testing is performed.

Figure 4A:
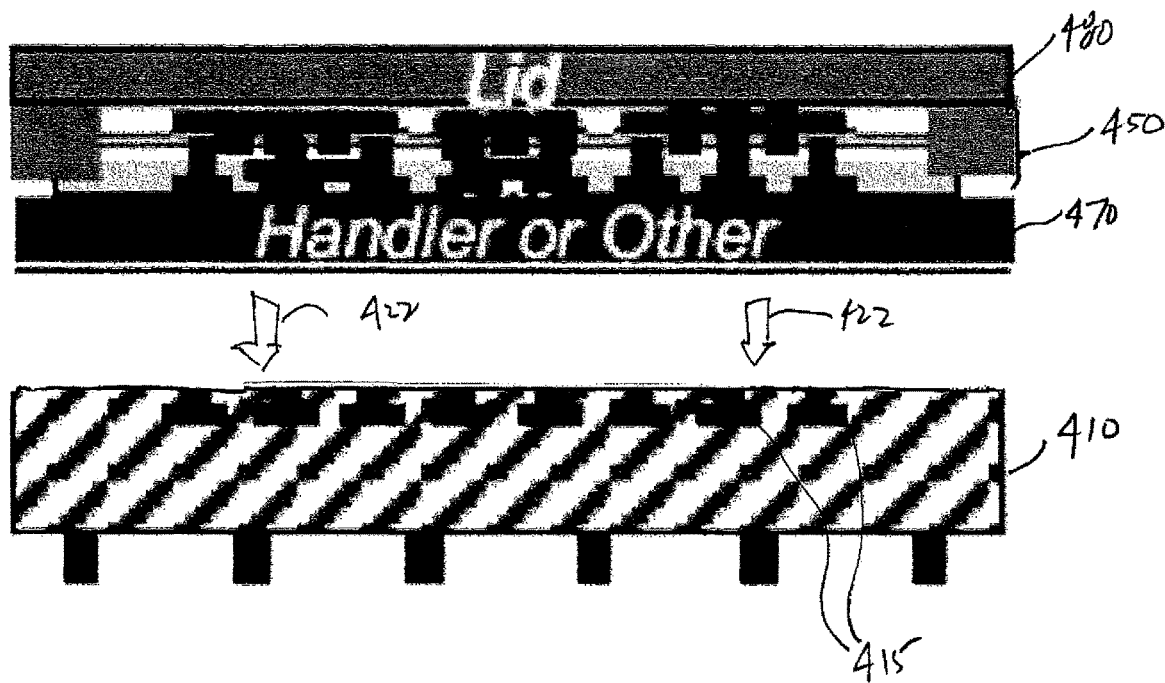
FIG. 4A is a schematic representation of a laminate substrate having integrated electrical components and vias and attachment thereof to a redistribution layer using a handle layer.
Figure 4B:
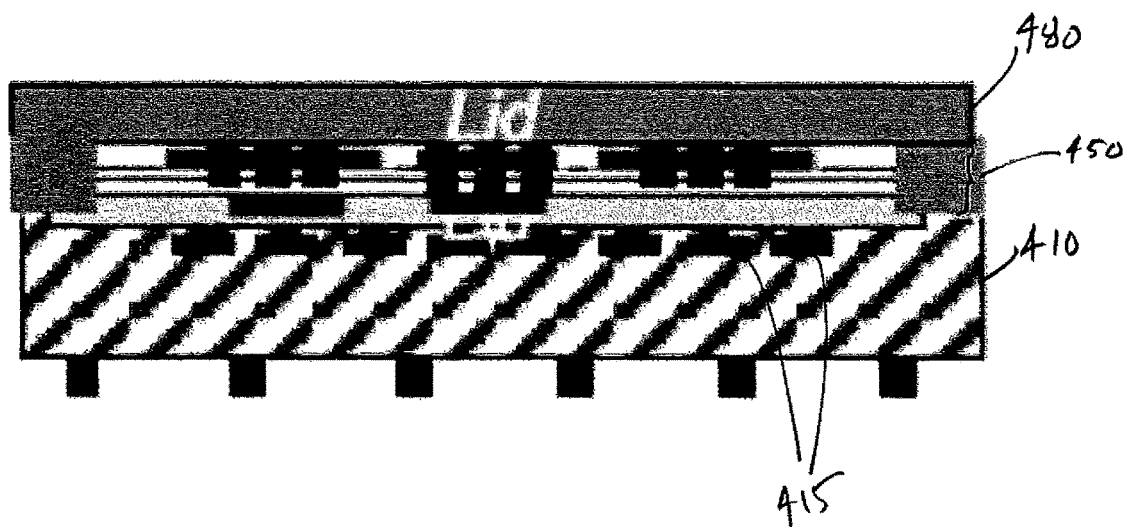
FIG. 4B is a schematic representation of the laminate substrate of FIG. 4A attached to the redistribution layer and having a lid.

In another exemplary embodiment, referring to FIGS. 4A and 4B, additional structures for WLP and/or TF and laminate or board integration with semiconductor dies are shown. Processes may be carried out as illustrated in FIGS. 2A and 2B; however, FIG. 4A illustrates an embodiment in which a laminate structure 410 is assembled with dies 415. An RDL 450 (integrated with any necessary components, chips, chiplets, or other devices) is disposed on a handle layer 470 (or vacuum chuck or integration hardware holder), and a lid 480 is deposited on the RDL 450. The handle layer 470 is then removed and the bottom surface of the RDL 450 can optionally be tested for known good sub-assembly and then can then be joined to the laminate structure 410 as shown by the arrows 422.

As shown in FIG. 4B, the handle layer 470 (or other vacuum chuck or integration hardware holder) is removed. Processes to align and integrate the sub-assemblies (for example, the RDL 450 and the laminate structure 410) as the coplanar (or parallel) laminates may use fine pitch interconnects with lid and stiffening seal bands. In an alternate embodiment, adhesives may be used. In some embodiments, however, alternate integration structures may be used to create an integrated module. Final testing is performed on a lidded integrated module with laminate, thin film/RDL, and chips/electronic components.

One advantage or high value attributes indicative of the exemplary embodiments disclosed herein is that the devices and methods provide for the integration of capacitors, inductors, HBM stacks, other memory chips, accelerators, I/O switch dies, and/or on module photonic integrated circuits and photonic packaging interconnections to waveguides and/or arrays of glass fibers or ribbons using combinations of RDL/WLP/PLP build technologies and flip chip or other precision assembly and integration technologies. The devices and methods also provide for strategic AI and heterogenous integration of hybrid cloud systems and edge computing systems. The embodiments disclosed herein also provide for industrial compatibility with WLP/PLP high density RDL and base laminate buildup technology integration. Also, higher power and thermal solutions with lower cost FOWLP die technologies are supported. Furthermore, low-cost packaging structures and build sequences to achieve high yields using standard WLP, PLP, and buildup panel laminates are realized.

In one example, an interconnect for a semiconductor device comprises a laminate substrate; a first plurality of electrical devices in or on a surface of the laminate substrate; a redistribution layer having a surface disposed on the surface of the laminate substrate; a second plurality of electrical devices in or on the surface of the redistribution layer; and a plurality of transmission lines between the first plurality of electrical devices and the second plurality of electrical devices. The surface of the laminate substrate and the surface of the redistribution layer are parallel to each other to form a dielectric structure and a conductor structure.

The transmission lines may comprise metal posts extending from the first plurality of electrical devices. The transmission lines may comprise vias extending from the first plurality of electrical devices. The interconnect may further comprise an adhesive dielectric layer between the redistribution layer and the laminate substrate. The first plurality of electrical devices and the second plurality of electrical devices may be connected using a solder interconnect. The surface of the laminate substrate and the surface of the redistribution layer may be adhesively joined.

In another example, a method of forming a semiconductor device comprises forming a coreless or multi-layer base laminate substrate; forming a first plurality of electrical devices in or on a surface of the laminate substrate; forming interconnection ports at the first plurality of electrical devices; forming a redistribution layer on the surface of the laminate substrate, the redistribution layer having a second plurality of electrical devices on or in a surface of the redistribution layer; and connecting the redistribution layer to the laminate substrate such that the second plurality of electrical devices is interconnected to the first plurality of electrical devices through the interconnection ports. When the redistribution layer is connected to the laminate substrate, the surface of the laminate substrate and the surface of the redistribution layer are parallel to each other.

The multi-layer base laminate substrate may be formed by sequential deposition of layers to form a board. The multi-layers may be formed from dielectric (such as organic polymers, glass and/or alternate dielectric materials and electrical/optical conductor materials such as Cu, Ni, Au, Ti, Ta, solder, Si, SiN, and/or alternate conductor materials, respectively). Forming interconnection ports at the first plurality of electrical devices may comprise forming metal posts at the first plurality of electrical devices. Forming interconnection ports at the first plurality of electrical devices may comprise forming vias at the first plurality of electrical devices. Connecting the redistribution layer to the laminate substrate may comprise applying flowable adhesive dielectric material between the redistribution layer and the laminate substrate. Forming the redistribution layer on the surface of the laminate substrate may comprise disposing the redistribution layer onto a handle layer and using the handle layer to connect the redistribution layer to the laminate substrate. The method may further comprise applying an adhesive between the surface of the laminate substrate and the surface of the redistribution layer.

In another example, a method for fabricating an interconnect for a semiconductor device comprises forming a coreless laminate substrate; forming a first plurality of electrical devices in or on a surface of the laminate substrate; forming first ends of interconnection ports at the first plurality of electrical devices; forming a second plurality of electrical devices at second ends of the interconnection ports distal from the first ends; forming a redistribution layer on a handle layer, the redistribution layer having a third plurality of electrical devices in or on the redistribution layer; connecting the redistribution layer to a handle layer; disposing the handle layer onto the second plurality of electrical devices; and removing the handle layer. The surface of the laminate substrate and the surface of the redistribution layer are parallel to each other to form a dielectric structure and a conductor structure.

The coreless laminate substrate may be formed by sequential deposition of layers to form a board. The interconnection ports may be metal posts or vias. The method may further comprise disposing a lid on the redistribution layer opposite to the handle layer. The surface of the laminate substrate and the surface of the redistribution layer may be adhesively joined.

LIST OF ABBREVIATIONS

AI artificial intelligence
BGA ball grid array
CMP chemical mechanical polishing
FOWLP fan out wafer level packaging
HBM high bandwidth memory
I/O input/output
LGA line grid array
NCP non-conductive paste
PLP panel level packaging
RDL redistribution layer
TF thin film
TIM thermal interface material
UBM under bump metallization
UF underfill
WLP wafer level packaging
CUF capillary underfill In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. An interconnect for a semiconductor device, the interconnect comprising:
    a laminate substrate;
    a first plurality of electrical devices in or on a surface of the laminate substrate;
    a redistribution layer having a surface disposed on the surface of the laminate substrate using a handle layer;
    a second plurality of electrical devices in or on the surface of the redistribution layer; and
    a plurality of transmission lines between the first plurality of electrical devices and the second plurality of electrical devices;
    wherein the surface of the laminate substrate and the surface of the redistribution layer are parallel to each other such that the first plurality of electrical devices and the second plurality of electrical devices are interconnected upon removal of the handle layer to form a dielectric structure and a conductor structure.

2. The interconnect of claim 1, wherein the transmission lines comprise metal posts extending from the first plurality of electrical devices.

3. The interconnect of claim 1, wherein the transmission lines comprises vias extending from the first plurality of electrical devices.

4. The interconnect of claim 1, further comprising an adhesive dielectric layer between the redistribution layer and the laminate substrate.

5. The interconnect of claim 1, wherein the first plurality of electrical devices and the second plurality of electrical devices are connected using a solder interconnect.

6. The interconnect of claim 1, wherein the surface of the laminate substrate and the surface of the redistribution layer are adhesively joined.

7. A method of forming a semiconductor device, the method comprising:
- forming a coreless laminate substrate;
- forming a first plurality of electrical devices in or on a surface of the laminate substrate;
- forming interconnection ports at the first plurality of electrical devices;
- forming a redistribution layer on a handle layer, the redistribution layer having a second plurality of electrical devices on or in a surface of the redistribution layer;
- connecting the redistribution layer to the laminate substrate using the handle layer such that the second plurality of electrical devices is interconnected to the first plurality of electrical devices through the interconnection ports;
- wherein when the redistribution layer is connected to the laminate substrate, the surface of the laminate substrate and the surface of the redistribution layer are parallel to each other.

8. The method of claim 7, wherein the coreless laminate substrate is formed by sequential deposition of layers to form a board.

9. The method of claim 7, wherein forming interconnection ports at the first plurality of electrical devices comprises forming metal posts at the first plurality of electrical devices.

10. The method of claim 7, wherein forming interconnection ports at the first plurality of electrical devices comprises forming vias at the first plurality of electrical devices.

11. The method of claim 7, wherein connecting the redistribution layer to the laminate substrate comprises applying flowable adhesive dielectric material between the redistribution layer and the laminate substrate.

12. The method of claim 7, further comprising applying an adhesive between the surface of the laminate substrate and the surface of the redistribution layer.

13. A method for fabricating an interconnect for a semiconductor device, the method comprising:
- forming a multi-layer base substrate;
- forming a first plurality of electrical and/or optical semiconductor devices in or on a surface of the multi-layer base substrate;
- forming first ends of interconnection ports at the first plurality of electrical and/or optical semiconductor devices;
- forming a second plurality of electrical and/or optical semiconductor devices at second ends of the interconnection ports distal from the first ends;
- forming a redistribution layer on a handle layer, the redistribution layer having a third plurality of electrical and/or optical semiconductor devices in or on the redistribution layer;
- connecting the redistribution layer to the handle layer;
- disposing the handle layer onto the second plurality of electrical and/or optical semiconductor devices; and
- removing the handle layer;
- wherein the surface of the multi-layer base substrate and the surface of the redistribution layer are parallel to each other to form dielectric and conductor structures.

14. The method of claim 13, wherein the multi-layer base substrate is formed by sequential deposition of layers to form a board.

15. The method of claim 13, wherein the multi-layer base substrate is famed from one or more dielectric materials selected from glass and organic polymers and from one or more electrical conductors and/or optical conductors selected from copper, nickel, gold, tungsten, titanium, tantalum, solder, silicon, and silicon nitride.

16. The method of claim 13, wherein the multi-layer base substrate comprises electrical and/or optical interconnections.

17. The method of claim 13, wherein the interconnection ports are metal posts or vias.

18. The method of claim 13, further comprising disposing a lid on the redistribution layer opposite to the handle layer.

19. The method of claim 13, wherein the surface of the multi-layer base substrate and the surface of the redistribution layer are adhesively joined.

* * * * *